United States Patent
Tokudome

(10) Patent No.: US 9,835,751 B2
(45) Date of Patent: Dec. 5, 2017

(54) PROXIMITY SENSOR AND KEYLESS ENTRY DEVICE INCLUDING THE SAME

(71) Applicant: U-SHIN LTD., Tokyo (JP)

(72) Inventor: Tetsuo Tokudome, Hiroshima (JP)

(73) Assignee: U-SHIN LTD, Tokyo (JP)

( * ) Notice: Subject to any disclaimer, the term of this patent is extended or adjusted under 35 U.S.C. 154(b) by 30 days.

(21) Appl. No.: 14/868,733

(22) Filed: Sep. 29, 2015

(65) Prior Publication Data

US 2016/0098877 A1    Apr. 7, 2016

(30) Foreign Application Priority Data

Oct. 1, 2014  (JP) .................................. 2014-203006
Aug. 18, 2015  (JP) .................................. 2015-161291

(51) Int. Cl.
*G01R 27/26* (2006.01)
*G07C 9/00* (2006.01)
(Continued)

(52) U.S. Cl.
CPC .................. *G01V 3/02* (2013.01); *G01V 3/12* (2013.01); *G07C 9/00309* (2013.01); *G07C 9/00944* (2013.01); *G07C 2209/64* (2013.01); *G07C 2209/65* (2013.01); *H03K 2217/960775* (2013.01)

(58) Field of Classification Search
CPC ........... G06F 3/044; G06F 2203/04101; G06F 2203/04102; G06F 3/017; G06F 3/0412; G07C 2009/00793; G07C 2209/64; G07C 9/00309; G07C 2009/0019; G07C 2009/00769; G07C 2209/65; G07C 9/00182; G09G 2360/14; G09G 2380/02; G09G 3/32; H04N 9/30
See application file for complete search history.

(56) References Cited

U.S. PATENT DOCUMENTS

2008/0154535 A1\*  6/2008  Sparks ............... G05B 19/0425
                                                    702/130
2011/0254570 A1\*  10/2011  Sage .................. H03K 17/9622
                                                    324/679

(Continued)

FOREIGN PATENT DOCUMENTS

| JP | 2003221948 A | 8/2003 |
| JP | 2012500919 A | 1/2012 |
| WO | 2010053013 A1 | 5/2010 |

*Primary Examiner* — Dionne H Pendleton
(74) *Attorney, Agent, or Firm* — Bainwood Huang

(57) ABSTRACT

In a proximity sensor including a circuit board on which a detection circuit is printed, and a first drive electrode and a lock electrode mounted on one surface of the circuit board and electrically connected to the detection circuit, the first planar drive electrode and the planar lock electrode are formed in a standing manner on one surface of the circuit board to face each other. A second planar drive electrode and a planar unlock electrode are formed in a standing manner on the other surface of the circuit board to face each other. The proximity sensor is used in a keyless entry device of vehicle, and the controller that controls driving of an actuator for locking or unlocking a vehicle door based on detection of the proximity sensor determines that the proximity sensor is turned on when decrease in output of the proximity sensor exceeds a predetermined threshold value.

10 Claims, 16 Drawing Sheets

(51) Int. Cl.
 *G01V 3/02* (2006.01)
 *G01V 3/12* (2006.01)

(56) References Cited

U.S. PATENT DOCUMENTS

| | | | | |
|---|---|---|---|---|
| 2013/0050130 | A1* | 2/2013 | Brown | G06F 3/044 |
| | | | | 345/174 |
| 2015/0054617 | A1* | 2/2015 | Fontanet | H03K 17/962 |
| | | | | 340/5.72 |
| 2016/0041663 | A1* | 2/2016 | Chen | G06F 3/0412 |
| | | | | 345/174 |
| 2016/0326778 | A1* | 11/2016 | Musat | H03K 17/955 |
| 2017/0030119 | A1* | 2/2017 | Usui | E05B 81/77 |
| 2017/0131786 | A1* | 5/2017 | Koshiyama | G06F 3/017 |
| 2017/0154484 | A1* | 6/2017 | Pluss | G07C 9/00309 |

\* cited by examiner

| | ELECTRODE VOLTAGE IN STATIONARY STATE | ELECTRODE VOLTAGE OBTAINED WHEN ONE FINGER OF PERSON CONTACTS WITH ELECTRODE | ELECTRODE VOLTAGE OBTAINED WHEN 100 ml CONTACT WITH ELECTRODE |
|---|---|---|---|
| CONVENTIONAL ELECTRODE CONFIGURATION | 1.19(V) | 0.93(V) | 1.06(V) |
| ELECTRODE CONFIGURATION ACCORDING TO THE EMBODIMENT | 1.26(V) | 0.83(V) | 1.16(V) |

FIG. 9

| | VOLTAGE DIFFERENCE BETWEEN ELECTRODE VOLTAGE IN STATIONARY STATE AND ELECTRODE VOLTAGE OBTAINED WHEN ONE FINGER OF PERSON CONTACTS WITH ELECTRODE | VOLTAGE DIFFERENCE BETWEEN ELECTRODE VOLTAGE IN STATIONARY STATE AND ELECTRODE VOLTAGE OBTAINED WHEN 100 ml OF WATER CONTACT WITH ELECTRODE |
|---|---|---|
| CONVENTIONAL ELECTRODE CONFIGURATION | 0.26(V) | 0.13(V) |
| ELECTRODE CONFIGURATION ACCORDING TO THE EMBODIMENT | 0.43(V) | 0.10(V) |

FIG. 10

| | CHANGE RATIO OF ELECTRODE VOLTAGE OBTAINED WHEN ONE FINGER OF PERSON CONTACTS WITH ELECTRODE TO ELECTRODE VOLTAGE IN STATIONARY STATE | CHANGE RATIO OF ELECTRODE VOLTAGE OBTAINED WHEN 100 ml OF WATER CONTACT WITH ELECTRODE TO ELECTRODE VOLTAGE IN STATIONARY STATE |
|---|---|---|
| CONVENTIONAL ELECTRODE CONFIGURATION | 21.80(%) | 10.90(%) |
| ELECTRODE CONFIGURATION ACCORDING TO THE EMBODIMENT | 34.10(%) | 7.90(%) |

FIG. 11

|  | DETECTION RESULT OBTAINED WHEN ONE FINGER OF PERSON CONTACTS WITH ELECTRODE | DETECTION RESULT OBTAINED WHEN 100 ml OF WATER CONTACT WITH ELECTRODE |
|---|---|---|
| CONVENTIONAL ELECTRODE CONFIGURATION | × | × |
| ELECTRODE CONFIGURATION ACCORDING TO THE EMBODIMENT | ○ | × |

FIG. 12

PROXIMITY SENSOR AND KEYLESS ENTRY DEVICE INCLUDING THE SAME

TECHNICAL FIELD

The present invention relates to a proximity sensor that employs a mutual capacitance system and a keyless entry device for vehicle including the proximity sensor.

BACKGROUND ART

In recent years, a vehicle includes a keyless entry device in which, a driver holds an electronic key including a transmitting function brings her/his hand close to or into contact with a door handle to automatically unlock or lock the door. The keyless entry device includes a proximity sensor built in a door handle of a vehicle, an antenna that transmits and receives a signal to/from an electronic key when the proximity sensor detects proximity or contact of a hand of person to the door handle, an actuator that locks or unlocks the door of the vehicle, and a controller that detect an ON/OFF state of the proximity sensor with an output from the proximity sensor and drives the actuator to lock or unlock the door when a code signal from the electronic key received by the antenna when the proximity sensor is turned on is matched with a code signal inherent in the vehicle.

A proximity sensor used in such a keyless entry device detects proximity or contact of a hand of person with an electrostatic capacity system. This is proposed in, for example, Patent Documents 1 and 2 or the like.

FIG. 16 shows FIG. 4 in Patent Document 1. A proximity sensor described in Patent Document 1 will be described below with reference to FIG. 4. The proximity sensor includes a circuit board on which a detection circuit is printed and a drive electrode (reference electrode) and a detection electrode (measuring electrode) which are mounted on the circuit board. In this case, the drive electrode and the detection electrode are surface-mounted on the circuit board, and are electrically connected to the detection circuit.

When a pulse-like voltage is applied to the drive electrode of the proximity sensor, an electric field is generated between the drive electrode and the detection electrode. When a hand of person is brought close to or into contact with the proximity sensor, electric flux lines emitted from the drive electrode to the detection electrode are partially absorbed with the hand of person serving as a dielectric substance. At this time, the electric flux lines reaching the detection electrode decrease in number. For this reason, a voltage induced by the detection electrode decreases. More specifically, when the decrease in voltage is measured to make it possible to detect that the hand of person is brought close to or into contact with the proximity sensor.

As shown in FIG. 4B in Patent Document 3, a proximity sensor in which a detection electrode of an unlock sensor is disposed on one mounting surface of a circuit board on which a detection circuit is printed and a detection electrode of a lock sensor is disposed on the other mounting surface is also disclosed.

SUMMARY OF INVENTION

Technical Issue

A proximity sensor used in a keyless entry device is built in a door handle of a vehicle, and the door handle is exposed to the outer surface of the vehicle body. For this reason, although rain serving as a dielectric substance may adhere to the door handle like a hand, and a difference between the dielectric constants of the rain and the hand has not been able to be accurately discriminated from each other. For this reason, the proximity sensor erroneously detects adhesion of rain to the door handle as proximity or contact of the hand of person to the door handle, and the keyless entry device erroneously operates to unintentionally unlock or lock the door disadvantageously.

The present invention has been made in consideration of the above issue, and has as its object to provide a proximity sensor that can prevent erroneous detection caused by adhesion of rain to a door handle and a keyless entry device that can prevent an erroneous operation of locking or unlocking a vehicle door caused by erroneous detection of the proximity sensor.

Address to Issues

The present invention provides the following items to solve the above issues.

(1) One or more embodiments of the present invention provide a proximity sensor including a circuit board on which a detection circuit is printed and a first drive electrode and a first detection electrode which are mounted on one surface of the circuit board and electrically connected to the detection circuit, wherein the first planar drive electrode and the first planar detection electrode are formed in a standing manner on one surface of the circuit board to face each other.

(2) One or more embodiments of the present invention provide the proximity sensor wherein, in the proximity sensor according to (1), a second planar drive electrode and a second planar detection electrode are formed in a standing manner on the other surface of the circuit board to face each other.

(3) One or more embodiments of the present invention provide a proximity sensor including a circuit board on which a detection circuit is printed and a first drive electrode and a first detection electrode which are mounted on one surface of the circuit board and electrically connected to the detection circuit, wherein the first planar drive electrode and the first planar detection electrode are formed in a standing manner on one surface of the circuit board to face each other, and an antenna which transmits/receives a signal to/from a mobile transmitter when proximity or contact to the first detection electrode is disposed between the first drive electrode and the first detection electrode.

(4) One or more embodiments of the present invention provide the proximity sensor wherein, in the proximity sensor according to (3), a second planar drive electrode and a second planar detection electrode are formed at a position spaced apart from the first drive electrode and the first detection electrode on the same plane as that on which the antenna of the circuit board is disposed to face each other.

(5) One or more embodiments of the present invention provide a keyless entry device including a proximity sensor built in a door handle of a vehicle, an antenna that transmits/receives a signal to/from a mobile transmitter when the proximity sensor detects proximity or contact of a person to the door handle, an actuator that locks or unlocks a door of the vehicle, and a controller that detects an ON/OFF state of the proximity sensor with an output from the proximity sensor and drives the actuator to lock or unlock the door when a code signal from the mobile transmitter received by the antenna when the proximity sensor is turned on is matched with a code signal inherent in the vehicle, wherein the proximity sensor is configured by any one of the proximity sensors according to (1) to (4), and the controller is designed to determine that the proximity sensor is turned on when a decrease in output of the proximity sensor exceeds a predetermined threshold value.

(6) One or more embodiments of the present invention provide a keyless entry device wherein, in the keyless entry device according to (5), the controller supplies a drive voltage to the drive electrode, repeatedly controls charging of a capacitor with a voltage output from the proximity sensor, measurement of a charging voltage value, and discharging of a charging voltage every predetermined period of time, compares a charging voltage value measured at this time with a charging voltage value measured previously, and determines that the proximity sensor is turned on when the difference between both the values exceeds a predetermined threshold value.

(7) One or more embodiments of the present invention provide the keyless entry device wherein, in the keyless entry device according to (5) or (6), one of the first detection electrode and the second detection electrode configures a lock electrode which detects an operation of a person in a door lock state, and the other configures an unlock electrode which detects an operation of the person in a door unlock state.

Advantageous Effects of Invention

The present inventor founds that, when a planar drive electrode and a planar detection electrode are formed on a mounting surface of a circuit board to face each other in a proximity sensor, a rate of decrease (decreasing rate) of the number of electric flux lines which are decreased in number by the proximity of a dielectric substance and which are generated between the drive electrode and the detection electrode by applying a pulse voltage to the drive electrode when a dielectric substance is a hand of person is different from that when the dielectric substance is water. More specifically, the rate of decrease of the number of electric flux lines when the dielectric substance is a hand of person is larger than that when the dielectric substance is water. Thus, the present inventor found that a voltage induced to the detection electrode when the dielectric substance is a hand of person is lower than that when the dielectric substance is water.

Thus, the proximity sensor according to (1) or (2) outputs a voltage lower when a dielectric substance is a hand of person than that when the dielectric substance is water. For this reason, when the proximity sensor is built in a door handle, which dielectric substance brought close to or into contact with the door handle is a hand of person or water can be advantageously recognized.

According to the keyless entry devices according to (5) and (6) each including the proximity sensor according to (1) or (2), an output voltage value of the proximity sensor is compared with a predetermined threshold value to make it possible to prevent erroneous detection caused by adhesion of rain to a door handle. For this reason, an erroneous operation of locking or unlocking a vehicle door can be prevented from being caused by erroneous detection of the proximity sensor.

The proximity sensor according to (3) outputs a lower voltage when a dielectric constant is a hand of person than that when the dielectric constant is water. For this reason, the proximity sensor is built in a door handle to make it possible to advantageously recognize which dielectric substance brought close to or into contact with the door handle is a hand of person or water. An antenna is disposed between a drive electrode and an unlock electrode (detection electrode) pairing therewith to make it possible to dispose the drive electrode, the unlock electrode (detection electrode) pairing therewith, and the antenna on the same plane. For this reason, the proximity sensor can be advantageously reduced in thickness. Furthermore, since the antenna is disposed between the drive electrode and the unlock electrode (detection electrode) pairing therewith to make an output voltage from the proximity sensor in a stationary state high, noise resistance is improved so as to improve an operational stability of the proximity sensor.

According to the proximity sensor according to (4), an unlock electrode (detection electrode), a drive electrode pairing therewith, a lock electrode (detection electrode), and a drive electrode pairing therewith are disposed on the same plane to make it possible to reduce the proximity sensor in thickness. For this reason, the proximity sensor can be advantageously easily built in a door handle.

According to the keyless entry devices according to (5) and (6) each including the proximity sensor according to (3) or (4), an output voltage value of the proximity sensor is compared with a predetermined threshold value to make it possible to prevent erroneous detection caused by adhesion of rain to a door handle. For this reason, an erroneous operation of locking or unlocking a vehicle door can be advantageously prevented from being caused by erroneous detection of the proximity sensor. Furthermore, according to the keyless entry devices according to (5) and (6) each including the proximity sensor according to (3) or (4), the proximity sensor can be reduced in thickness. For this reason, the keyless entry device can be advantageously easily built in the door handle.

According to the keyless entry device according to (7), one of one detection electrode formed in a standing manner on one surface of a circuit board and a second detection electrode formed in a standing manner on the other surface of the circuit board configures a lock electrode that detects an action of a hand of person in a door lock state, and the other configures an unlock electrode that detects an action of a hand of person in a door unlock state. For this reason, an output voltage value of the proximity sensor is compared with a predetermined threshold value to make it possible to prevent erroneous detection caused by adhesion of rain to a door handle. Thus, according to the keyless entry devices according to (5) and (6), both intentions of a driver to lock and unlock the door can be accurately detected, and the door can be automatically locked or unlocked depending on the detected intention of the driver.

BRIEF DESCRIPTION OF DRAWINGS

FIG. 9 is a diagram showing experiment data according to the first embodiment of the present invention.

FIG. 10 is a diagram showing experiment data according to the first embodiment of the present invention.

FIG. 11 is a diagram showing experiment data according to the first embodiment of the present invention.

FIG. 12 is a diagram showing experiment data according to the first embodiment of the present invention.

DETAILED DESCRIPTION

First Embodiment

A first embodiment of the present invention will be described below with reference to FIG. 1 to FIG. 8.
<Configuration of Proximity Sensor>

A configuration of a proximity sensor according to the embodiment will be described below with reference to FIG. 1 to FIG. 5.

Figure 1:
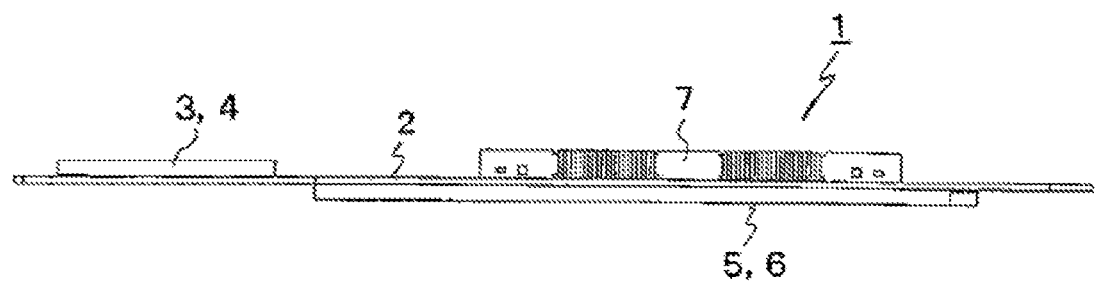
FIG. 1 is a side view of a proximity sensor according to a first embodiment of the present invention.
Figure 2:
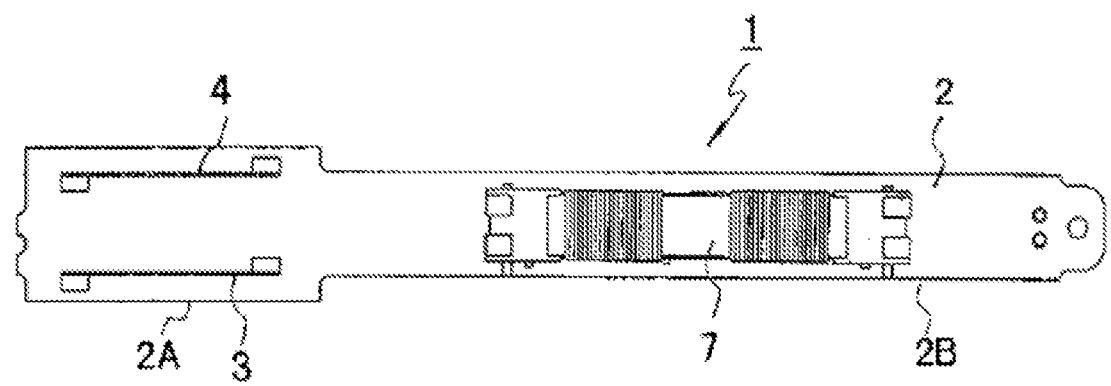
FIG. 2 is a plan view of the proximity sensor according to the first embodiment of the present invention.
Figure 3:
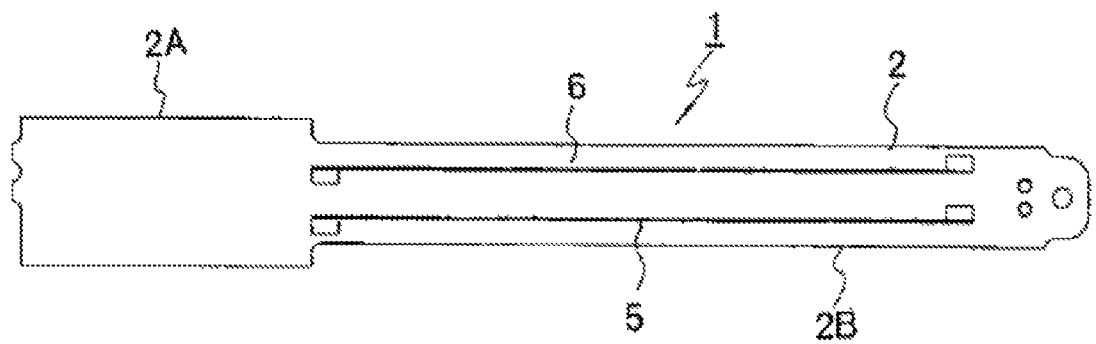
FIG. 3 is a bottom view of the proximity sensor according to the first embodiment of the present invention.
Figure 4:
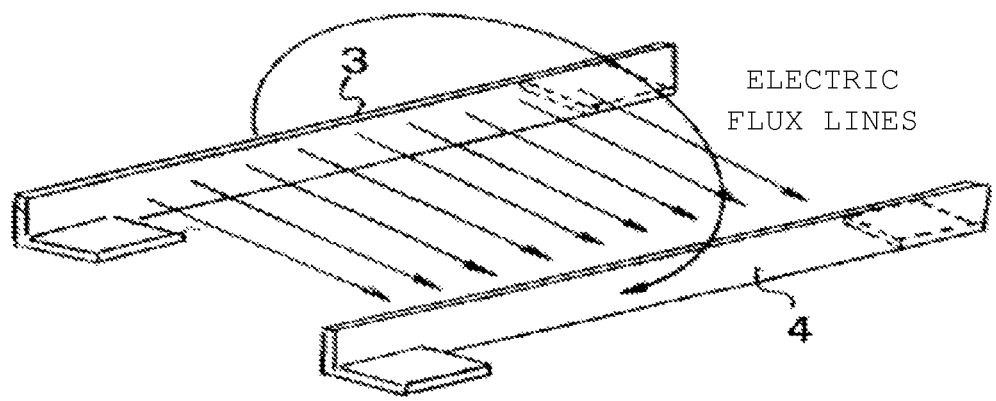
FIG. 4 is a perspective view of a drive electrode and a detection electrode (lock electrode) in the proximity sensor according to the first embodiment of the present invention.
Figure 5:
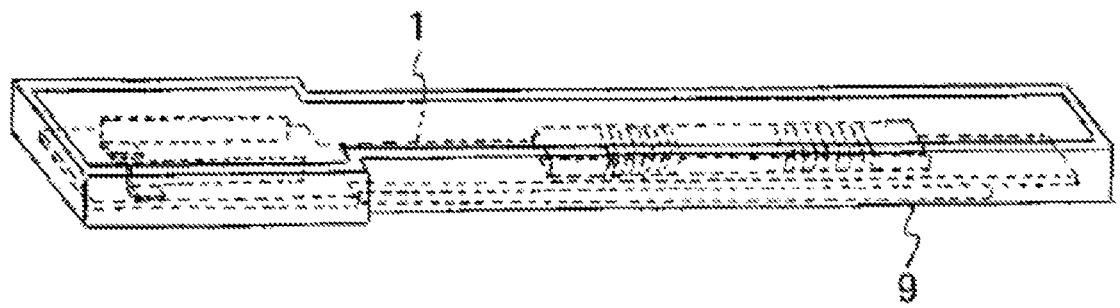
FIG. 5 is a perspective view showing a state in which the proximity sensor according to the first embodiment of the present invention is integrated with a case.

FIG. 1 is a side view of a proximity sensor according to the embodiment, FIG. 2 is a plan view of the proximity sensor, FIG. 3 is a bottom view of the proximity sensor, FIG. 4 is a perspective view of a drive electrode and a detection electrode (lock electrode) of the proximity sensor, and FIG. 5 is a perspective view showing a state in which the proximity sensor is integrated with a case.

A proximity sensor 1 according to the embodiment generates an electric field between electrodes by a mutual capacitance system to detect proximity or contact of a hand of a person (driver), and is used in a keyless entry device 10 (see FIG. 6) (will be described later).

In the proximity sensor 1 according to the embodiment, as shown in FIG. 1 and FIG. 2, on one plane (to be referred to as an "upper surface" hereinafter) of a wide portion 2A which is of a long and narrow planar circuit board 2 and which is short and wide, a first drive electrode 3 and a first detection electrode (to be referred to as a "lock electrode" hereinafter) 4 are formed in a standing manner to face each other.

On the other plane (to be referred to a lower surface hereinafter) of a narrow portion 2B which integrally extends from the wide portion 2A of the circuit board 2 and which is long and narrow, a second drive electrode 5 and a detection electrode (to be referred to an "unlock electrode" hereinafter) 6 which are longer than the first drive electrode 3 and the first detection electrode (lock electrode) 4 are formed in a standing manner to face each other.

On the upper surface of the narrow portion 2B of the circuit board 2, a transmitting/receiving antenna 7 included in a keyless entry device 10 (will be described later) is mounted. On the circuit board 2, a detection circuit 8 (will be described later) (see FIG. 7) is printed.

The first drive electrode 3 and the first detection electrode (lock electrode) 4 are formed such that, as shown in FIG. 4, both the longitudinal ends of a long and narrow rectangular conductive metal plate made of copper or the like are bent at a right angle in directions opposite to each other, and each of the bent portions is soldered on the upper surface of the wide portion 2A of the circuit board 2. In this manner, the first drive electrode 3 and the first detection electrode (lock electrode) 4 are vertically formed in a standing manner on the upper surface of the wide portion 2A of the circuit board 2 to face each other as described above.

Similarly, the second drive electrode 5 and the second detection electrode (unlock electrode) 6 are also formed such that both the longitudinal ends of a long and narrow rectangular conductive metal plate made of copper or the like are bent at a right angle in directions opposite to each other, and each of the bent portions is soldered on the lower surface of the wide portion 2B of the circuit board 2. In this manner, the second drive electrode 5 and the second detection electrode 6 are vertically formed in a standing manner on the lower surface of the wide portion 2B of the circuit board 2 to face each other as described above. The first drive electrode 3 and the second drive electrode 5 are electrically connected to each other with a pattern connection.

The first drive electrode 3, the second drive electrode 5, the first detection electrode (lock electrode) 4, and the second detection electrode (unlock electrode) 6 need only be formed in a standing manner on the upper surface or the lower surface of the circuit board 2 to face each other. For this reason, the first drive electrode 3, the second drive electrode 5, the first detection electrode (lock electrode) 4, and the second detection electrode (unlock electrode) 6 need not vertically formed in a standing manner on the upper surface or the lower surface of the circuit board 2. For example, facing electrodes may be formed without completely overlapping to secure a predetermined distance or more as a horizontal minimum distance between the facing electrodes. Furthermore, the electrodes may be bent according to conditions found by experiments such that projected areas of the facing portions are equal to or larger than a predetermined area.

The proximity sensor 1 configured as described above is housed in a case 9 having a small thickness shown in FIG. 5, integrated with the case 9 by resin potting or low-pressure resin molding, and built in a door handle (not shown) of a vehicle together with the case 9. The proximity sensor 1 is built in the door handle such that the first drive electrode 3 and the first detection electrode (lock electrode) 4 face the outer surface side of the door handle and the second drive electrode 5 and the second detection electrode (unlock electrode) 6 face the inner surface side of the door handle.
<Configuration and Processing of Keyless Entry Device>

A keyless entry device according to the embodiment will be described with reference to FIG. 6 to FIG. 8.

Figure 6:
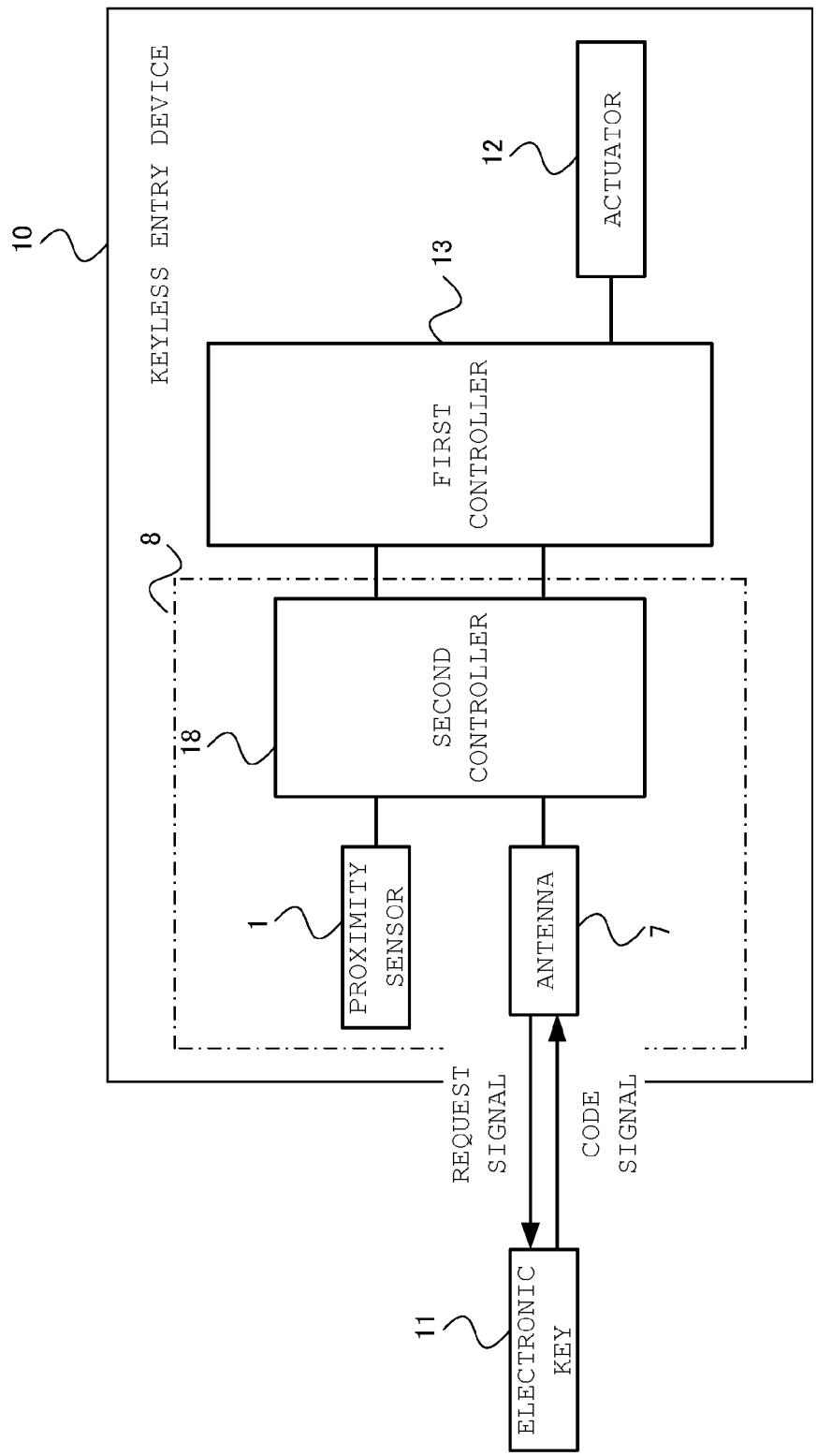
FIG. 6 is a block diagram showing a system configuration of a keyless entry device according to the first embodiment of the present invention.
Figure 7:
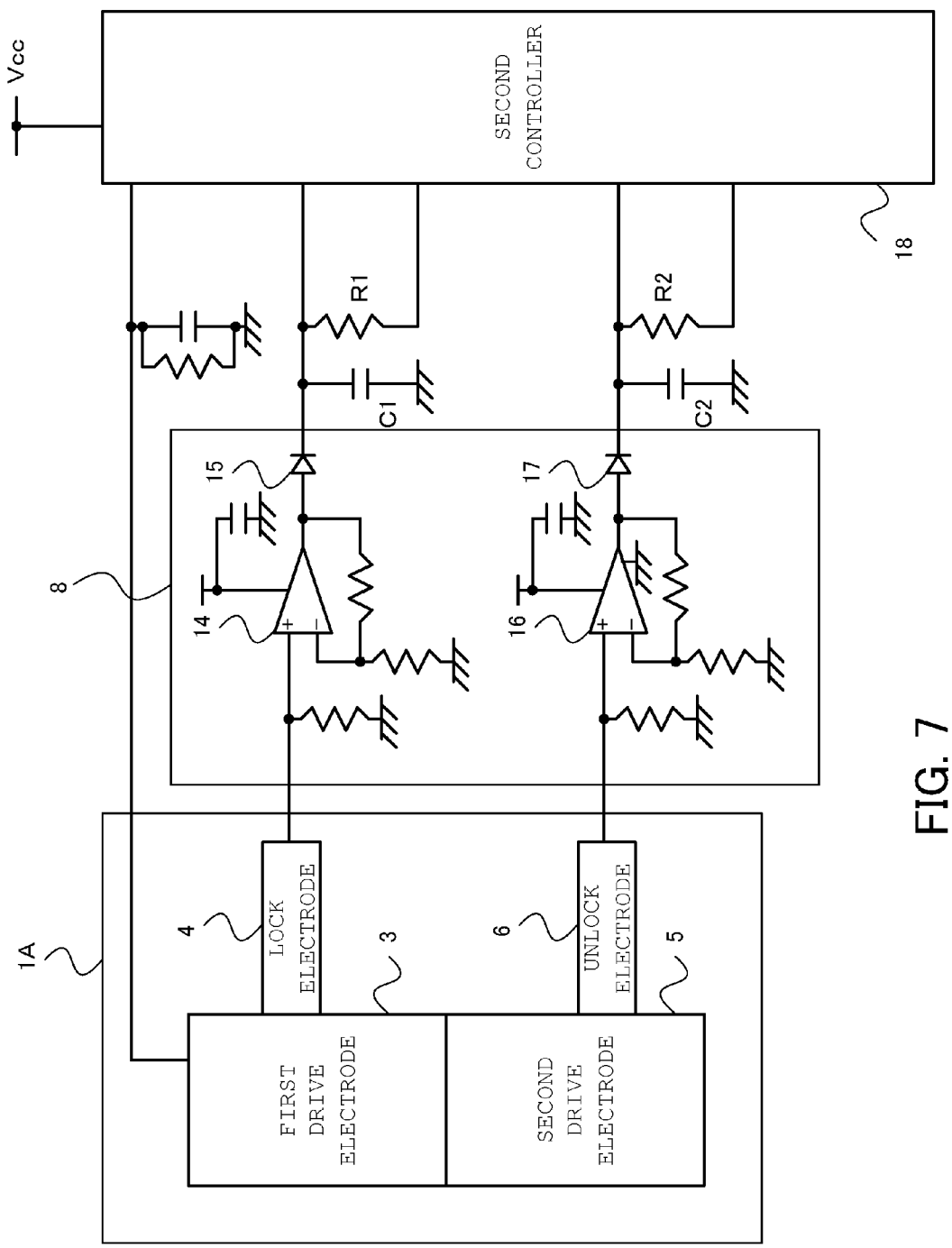
FIG. 7 is an electric circuit diagram of the keyless entry device according to the first embodiment of the present invention.
Figure 8:
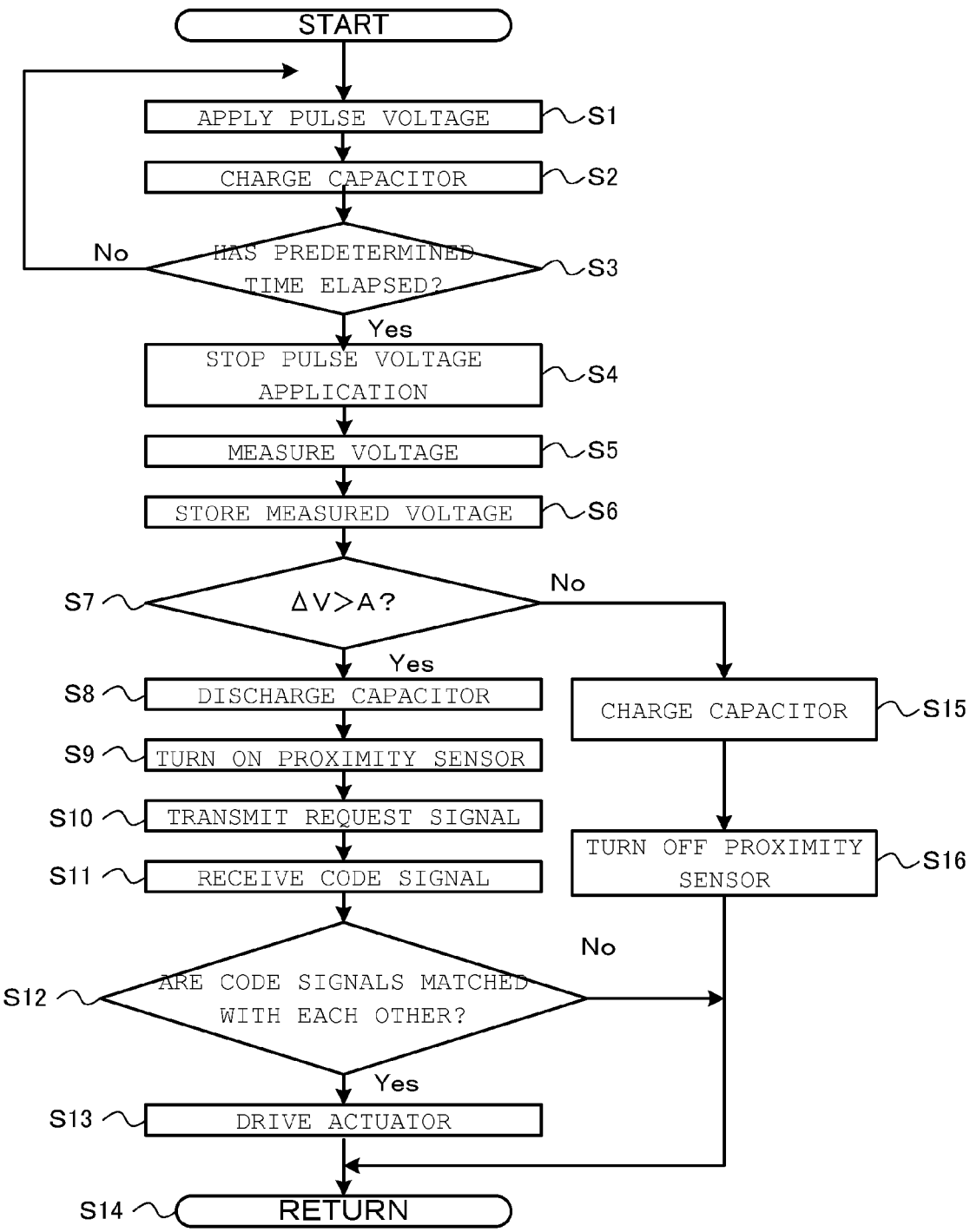
FIG. 8 is a flow chart showing an operation of the keyless entry device according to the first embodiment of the present invention.

FIG. 6 is a block diagram showing a system configuration of the keyless entry device according to the present invention, FIG. 7 is an electric circuit diagram of the keyless entry device, and FIG. 8 is a flow chart showing an operation of the keyless entry device.
<Configuration of Keyless Entry Device>

A keyless entry device 10 according to the embodiment automatically unlocks or locks a door of a vehicle such that a person (to be referred to as a "driver" hereinafter) carries an electronic key 11 (see FIG. 6) serving as a mobile transmitter and brings her/his hand close to a door handle (not shown) of the vehicle or touches the door handle with her/his hand.

The keyless entry device 10 according to the present invention, as shown in FIG. 6, includes the proximity sensor 1 built in a door handle (not shown) of a vehicle, the antenna 7 that transmits/receives a signal to/from the electronic key 11 when the proximity sensor 1 detects proximity or contact of a hand of a driver to the door handle, the detection circuit 8, an actuator 12 such as a latch unit that locks or unlocks a door of the vehicle, and a first controller (keyless ECU) 13 that detects an ON/OFF state of the proximity sensor 1 by an output from the proximity sensor 1 to drive and control the actuator 12.

The proximity sensor 1 mentioned here includes an electrode unit 1A including the first drive electrode 3, the first detection electrode (lock electrode) 4, the second drive electrode 5, and the second detection electrode (unlock electrode) 6 which are mounted on the circuit board (see FIG. 1 to FIG. 3) as described above.

The detection circuit 8 includes a second controller (microcomputer) 18. As shown in FIG. 7, the detection circuit 8 includes an operational amplifier 14 and a diode 15 which are disposed on a path for connecting the first detection electrode (lock electrode) 4 and the second controller 18 to each other, and an operational amplifier 16 and a diode 17 which are disposed on a path for connecting the second detection electrode (unlock electrode) 6 and the second controller 18 to each other.

A charging capacitor C1 and a discharging resistor R1 are disposed on the path for connecting the first detection electrode (lock electrode) 4 and the second controller 18 to each other, and a charging capacitor C2 and a discharging resistor R2 are disposed on a path for connecting the second detection electrode (unlock electrode) 6 and the first controller 13 to each other.

The second controller 18 has a function of applying a pulse voltage to the first drive electrode 3 and the second drive electrode 5 of the proximity sensor 1 and a function of detecting an ON/OFF state of the proximity sensor 1. A DC power supply Vcc is connected to the second controller 18 and mutually connected to the first controller 13 with a communication line. The second controller 18 has a function of detecting an ON state of the proximity sensor 1 and causing the antenna 7 to transmit a request signal to the electronic key 11.

On the other hand, the first controller 13 has a function of collating a code signal returned from the electronic key 11 to the antenna 7 in response to the request signal with a code signal inherent in the vehicle, and a function of driving the actuator 12 when both the codes signals are matched with each other and locking or unlocking a door of the vehicle.

Although not shown, in the second controller 18, an oscillator that generates a pulse voltage, a timer that measures oscillation time of the oscillator, a memory that stores a measured voltage value, and the like are built.

<Processing of Keyless Entry Device>

Processing of the keyless entry device 10 according to the embodiment (processing performed by the first controller 13 and the second controller 18) will be described below with reference to the flow chart shown in FIG. 8.

When the keyless entry device 10 operates, the second controller 18 applies a pulse voltage having a predetermined frequency (for example, 125 kHz) to the first drive electrode 3 and the second drive electrode 5 of the proximity sensor 1 (step S1 in FIG. 8).

At this time, electric fields are generated between the first drive electrode 3 and the first detection electrode (lock electrode) 4 and between the second drive electrode 5 and the second detection electrode (unlock electrode) 6 to generate electric flux lines extending from the first drive electrode 3 to the first detection electrode (lock electrode) 4 (see FIG. 4). Similarly, electric flux lines extending from the second drive electrode 5 to the second detection electrode (unlock electrode) 6 are generated. For this reason, voltages are induced at the first detection electrode (lock electrode) and the second detection electrode (unlock electrode) 6. The voltages induced at the first detection electrode (lock electrode) 4 and the second detection electrode (unlock electrode) 6 are amplified by the operational amplifiers 14 and 16 of the detection circuit 8 to charge the capacitors C1 and C2, respectively (step S2). The applications of the pulse voltages to the first drive electrode 3 and the second drive electrode 5 may be simultaneously performed, or the applications of the pulse voltages to the first drive electrode 3 and the second drive electrode 5 may be separately performed depending on circumstances.

For example, when the driver intends to open a locked door to rid a parking vehicle, when the driver inserts her/his hand into the inside of a door handle (not shown), some of electric flux lines generated from the second drive electrode 5 to the second detection electrode (unlock electrode) 6 of the proximity sensor 1 built in the door handle (not shown) are absorbed by the hand of the driver serving as a dielectric substance. For this reason, the number of generated electric flux lines decreases to lower a voltage induced at the second detection electrode (unlock electrode) 6. In this manner, a load (voltage) charged in the capacitor C2 also lowers.

The driver gets out of the vehicle and then close the door, and brings her/his hand close to or into contact with the door handle (not shown) to change the unlock state of the door into the lock state. In this case, since some of electric flux lines generated from the first drive electrode 3 to the first detection electrode (lock electrode) 4 of the proximity sensor 1 built in the door handle (not shown) are absorbed by the hand of the driver serving as a dielectric substance, the number of electric flux lines decreases to lower a voltage induced at the lock electrode 4. For this reason, electric charges (voltage) charged in the capacitor C1 lowers.

The application of a pulse voltage and the charging to the capacitors C1 and C2 are performed for a predetermined time which is set in advance. More specifically, the second controller 18 determines whether a time measured by a timer built therein exceeds the predetermined time (step S3). When the predetermined time has not elapsed (step S3: No), the above processing (oscillation and charging) is repeated. When the predetermined time has elapsed (step S3: Yes), the application of the pulse voltage is stopped (step S4).

Thereafter, the voltage values of the charged capacitors C1 and C2 are measured (step S5), and the measured voltage values are stored in a memory (step S6). The voltage values measured at this time are compared with the voltage values previously measured and stored in the memory to determine whether potential differences ΔV between the voltage values measured at this time and the voltage values previously measured exceed a predetermined threshold value A (step S7).

When a hand of the driver is brought close to or into contact with the door handle (not shown), quantities of electric charge charged in the capacitors C1 and C2 decrease as described above. For this reason, the voltage value of the capacitor C1 or C2 is smaller than the voltage value measured previously.

In this case, the first controller 13 determines which of the voltage value of the capacitor C1 on the lock side and the voltage value of the capacitor C2 on the unlock side lowers. According to the result, the first controller determines the intention of the driver, i.e., whether the driver intends to lock an unlocked door or, on the contrary, intends to unlock the locked door.

The present invention found that, in the proximity sensor, when a planar drive electrode and a planar detection electrode are formed in a standing manner on a mounting surface of a circuit board to face each other, a rate of decrease (decreasing rate) of the number of electric flux lines generated between the drive electrode and the detection electrode by application of a pulse voltage to the drive electrode, the decrease being caused by proximity of a dielectric substance, when the dielectric substance is a hand is different from that when the dielectric substance is water, and found by an experiment that the rate of decrease of the number of electric flux lines when the dielectric substance is a person is higher than that when the dielectric substance is water. For this reason, voltages induced at the detection electrode when the dielectric substance is a hand of person is lower than that when the dielectric substance is water.

The intensity of an electric field is in proportion to (1/distance), and does not sharply drop even though the electric field is distant from the detection electrode. For this reason, the present inventor found by an experiment that long-range detection could be achieved.

On the basis of experiment results shown in FIG. 9 to FIG. 12, the contents described above will be concretely described here.

<Experimental Condition>

On a 410 mm×300 mm GND plane (metal plate connected to the GND), a 150 mm×150 mm×22 mm resin table was placed. A planar electrode (electrode arrangement structure according to the conventional technique) or facing electrode (electrode arrangement structure according to the embodiment) was placed on the table. The facing electrodes were obtained by causing 25 mm×2.5 mm×0.3 mm metal plates to face each other at a 10 mm interval, and the planar electrode was obtained by disposing 25 mm×2.5 mm metal plates at 1 mm intervals. In this state, voltage values obtained when one finger was placed at a position 5.5 mm above the electrode and when 100 ml of water were placed at the position were compared with each other in the planar electrode and the facing electrodes. Note that the circuit constants were not changed.

<Experiment Result>

As shown in FIG. 9, the electrode voltage obtained when one finger of person was placed at a position 5.5 mm above the electrode was 0.93 (V) in the conventional electrode configuration, and was 0.83 (V) in the electrode configuration according to the embodiment. On the other hand, when 100 ml of water were placed at a position 5.5 mm above the electrode, the electrode voltage was 1.06 (V) in the conventional electrode configuration and 1.16 (V) in the electrode configuration according to the embodiment.

As shown in FIG. 9 to FIG. 10, a potential difference between an electrode voltage in a stationary state and the electrode voltage obtained when one finger of person was placed at the position 5.5 mm above the electrode was 0.26 (V) in the conventional electrode configuration and 0.43 (V) in the electrode configuration according to the embodiment. On the other hand, the electrode voltage obtained when 100 ml of water were placed at a position 5.5 mm above the electrode was 0.13 (V) in the conventional electrode configuration and 0.10 (V) in the electrode configuration according to the embodiment. As is apparent from this, when one finger of person is placed at the position 5.5 mm above the electrode in the electrode configuration according to the embodiment, a difference value between the resultant electrode voltage and the electrode voltage in the stationary state is large. When 100 ml of water are placed at the position 5.5 mm above the electrode in the conventional electrode configuration, the difference value between the obtained value and the electrode voltage in the stationary state in the conventional electrode configuration is not largely different from that in the electrode configuration according to the embodiment.

Furthermore, as shown in FIG. 9 to FIG. 11, a change ratio of the electrode voltage obtained when one finger of person was placed at a position 5.5 mm above the electrode to the electrode voltage in the stationary state was 21.80(%) in the conventional electrode configuration and 34.10(%) in the electrode configuration according to the embodiment. On the other hand, a change ratio of the electrode voltage obtained when 100 ml of water were placed at a position 5.5 mm above the electrode was 10.90(%) in the conventional electrode configuration and 7.90(%) in the electrode configuration according to the embodiment. As is apparent from this, when one finger of person is placed at the position 5.5 mm above the electrode in the electrode configuration according to the embodiment, the change ratio of the obtained electrode voltage to the electrode voltage in the stationary state is maximum. When 100 ml of water are placed at the position 5.5 mm above the electrode in the conventional electrode configuration, the change ratio of the obtained electrode voltage to the electrode voltage in the stationary state is not largely different from that in the electrode configuration according to the embodiment.

According to FIG. 9 to FIG. 11, since a change ratio of the electrode voltage to the electrode voltage in the stationary state is large when one finger of person is placed at a position 5.5 mm above the electrode in the electrode configuration according to the embodiment, it can be said that the highest sensitivity is achieved. In the electrode configuration according to the embodiment, the difference value between a voltage obtained when one finger of person is placed at the position 5.5 mm above the electrode and a voltage obtained when 100 ml of water are placed at the position 5.5 mm above the electrode is maximum. For this reason, in the electrode configuration according to the embodiment, when an appropriate threshold value is set, it can be deduced that the case in which one finger of person is placed at the position 5.5 mm above the electrode can be clearly discriminated from the case in which 100 ml of water are placed at the position 5.5 mm above the electrode.

FIG. 12 shows a verification experiment result to verify the above deduction. According to FIG. 12, as detection results obtained when one finger of person is placed at a position 5.5 mm above the electrode and when 100 ml of water are placed at the position 5.5 mm above the electrode, the detection result could be detected only when one finger of person was placed at the position 5.5 mm above the electrode in the electrode configuration according to the embodiment. As is apparent from this, as deduced, it could be proofed that, when the appropriate threshold value was set, the case in which one finger of person contacted and the case in which 100 ml of water contacted could be clearly discriminated from each other.

Thus, in the embodiment, voltage values of the capacitors C1 and C2 measured when a hand of a driver is brought close to or in into contact with a door handle (not shown) decreases largely more than voltages of the capacitors C1 and C2 measured when rain adheres to the door handle (not shown). For this reason, a threshold value A of the positional difference $\Delta V$ for determining an ON state of the proximity sensor 1 is set to be larger than the potential difference obtained when rain adheres to the door handle (not shown) and to be smaller than the potential difference obtained when the hand of the driver is brought close to or into contact with the door handle (not shown). When the potential difference ΔV exceeds the threshold value A, it is determined that the proximity sensor 1 is turned on. Even though rain adheres to the door handle (not shown), the proximity sensor 1 is not turned on, and the adhesion of rain to the door handle (not shown) is prevented from being erroneously detected as proximity or contact of the hand of the driver to the door handle (not shown) not to turn on the proximity sensor 1.

When the potential difference ΔV between the voltage value measured at this time and the voltage value measured previously is compared with the predetermined threshold value A (step S7), electric charges charged in the capacitors C1 and C2 are discharged with the resistors R1 and R2 when the voltage values are read by the second controller 18 (steps S8 and S15).

As a result of the determination in step S7, when the potential difference ΔV between the voltage value measured at this time and the voltage value measured previously exceeds the predetermined threshold value A (step S7: Yes), it is determined that the proximity sensor 1 is turned on (step S9).

When it is determined that the proximity sensor 1 is turned on as described above, the second controller 18 transmits a request signal from the antenna 7 to the electronic key 11 carried by a driver (step S10). The electronic key 11 which receives the request signal returns a code signal toward the antenna 7 (step S11).

The first controller 13 collates the code signal returned from the electronic key 11 with a code signal inherent in the vehicle to determine whether the code signal returned from the electronic key 11 is matched with the code signal inherent in the vehicle (step S12).

As a result of the determination, when the code signal returned from the electronic key 11 is matched with the code signal inherent in the vehicle (step S12: Yes), the first controller 13 drives the actuator 12 to lock or unlock a door (step S13).

More specifically, when the hand of the driver is brought close to or into contact with the surface side of the door handle (not shown), the voltage value of the capacitor C1 on the lock side lowers. For this reason, the second controller 18 determines that the driver intends to lock the door and drives the actuator 12 to lock an unlocked door.

When the hand of the driver is inserted into the inside of the door handle, the voltage of the capacitor C2 on the unlock side lowers. For this reason, the second controller 18 determines that the driver intents to unlock the door and drives the actuator 12 to unlock a locked door.

As described above, when the actuator 12 is driven to lock or unlock the door (step S13), a series of processing are finished. Thereafter, the same processing as described above is repeated (step S14).

As a result of the determination in step S7, when the potential difference ΔV between the voltage values of the capacitors C1 and C2 is equal to or larger than the threshold value A (ΔV≤A) (step S7: No), it is determined that the proximity sensor 1 is in an off state (step S16).

As a result of the determination in step S12, when the code signal returned from the electronic key 11 is not matched with the code signal inherent in the vehicle (step S12: No), the processing is simply finished.

As described above, in the embodiment, according to the proximity sensor 1, the case in which rain adheres to a door handle (not shown) and the case in which a hand of a driver is brought close to or into contact with the door handle can be clearly discriminated from each other. For this reason, adhesion of rain to the door handle (not shown) is not erroneously detected as proximity or contact of the hand of the driver to the door handle. Thus, only when the hand of the driver is brought close to or into contact with the door handle (not shown), the proximity sensor 1 can accurately detect the proximity or the contact.

More specifically, in the keyless entry device 10 including the proximity sensor 1, an erroneous operation of locking or unlocking a vehicle door caused by erroneous detection of the proximity sensor 1 by adhesion of rain to a door handle (not shown) can be prevented. For this reason, the door can be advantageously reliably prevented from being locked or unlocked without intention of the driver.

Second Embodiment

A second embodiment of the present invention will be described below with reference to FIG. 13 to FIG. 15. Since the configuration and processing of a keyless entry device in the second embodiment are the same as those in the first embodiment, a detailed description thereof will not be made.

<Configuration of Proximity Sensor>

A configuration of a proximity sensor according to the embodiment will be described with reference to FIG. 13 to FIG. 15.

Figure 13:
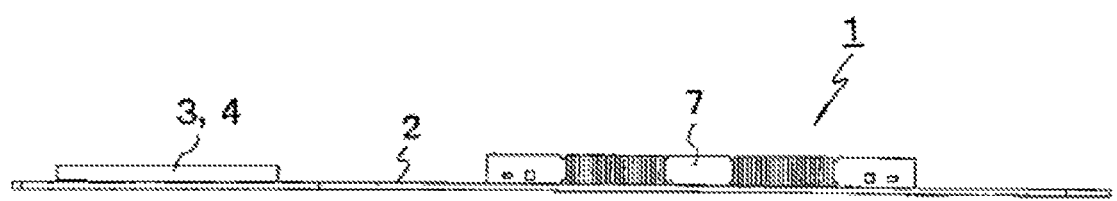
FIG. 13 is a side view of a proximity sensor according to a second embodiment of the present invention.
Figure 14:
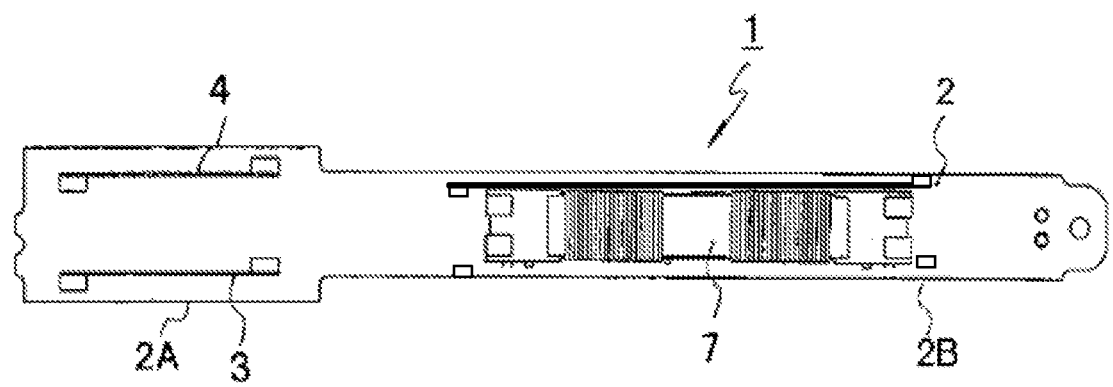
FIG. 14 is a plan view of the proximity sensor according to the second embodiment of the present invention.
Figure 15:
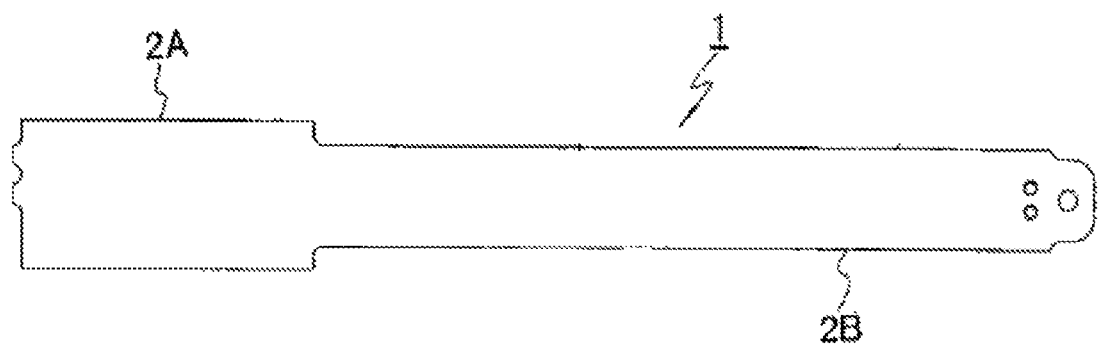
FIG. 15 is a bottom view of the proximity sensor according to the second embodiment of the present invention.
Figure 16:
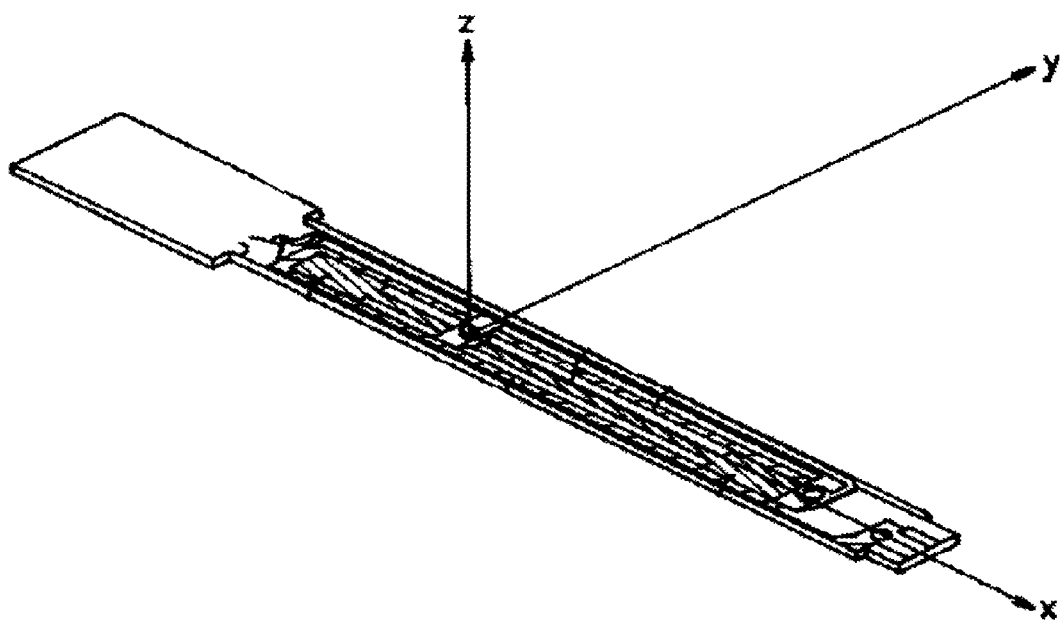
FIG. 16 is a plan view of a proximity sensor according to a related art.

FIG. 13 is a side view of the proximity sensor according to the embodiment, FIG. 14 is a plan view of the proximity sensor, and FIG. 15 is a bottom view of the proximity sensor.

In the proximity sensor 1 according to the embodiment, as shown in FIG. 13 and FIG. 14, on one plane (to be referred to as an "upper surface" hereinafter) of the wide portion 2A which is of the long and narrow planar circuit board 2 and which is short and wide, the first drive electrode 3 and the first detection electrode (to be referred to as a "lock electrode" hereinafter) 4 are vertically formed in a standing manner to face each other.

On a plane (the same plane as the plane on which the first drive electrode 3 and the first detection electrode are disposed) of the narrow portion 2B which integrally extends from the wide portion 2A of the circuit board 2 and which is long and narrow, the second drive electrode 5 and the detection electrode (to be referred to as an "unlock electrode" hereinafter) 6 which are longer than the first drive electrode 3 and the first detection electrode (lock electrode) 4 are vertically formed in a standing manner to face each other and to sandwich the antenna 7. A pulse voltage is applied to the second drive electrode 5, and, after a sensing operation is finished, the antenna is activated. For this reason, the second drive electrode 5 and the antenna do not simultaneously operate, and an electric field generated between the drive electrode and the detection electrode does not influence the antenna. However, since the metal electrode is close to the antenna consequently, in practice, a metal which is prevented from being magnetized is preferably selected as an electrode material.

The detection circuit (will be described later) is printed on the circuit board 2.

The first drive electrode 3 and the first detection electrode (lock electrode) 4, as shown in FIG. 4, both the longitudinal ends of a long and narrow rectangular conductive metal plate made of copper or the like are bent at a right angle in directions opposite to each other, and each of the bent portions is soldered on the upper surface of the wide portion 2A of the circuit board 2. In this manner, the first drive electrode 3 and the first detection electrode (lock electrode)

4 are vertically formed in a standing manner on the upper surface of the wide portion 2A of the circuit board 2 to face each other as described above.

Similarly, the second drive electrode 5 and the second detection electrode (unlock electrode) 6 are also formed such that both the longitudinal ends of a long and narrow rectangular conductive metal plate made of copper or the like are bent at a right angle in directions opposite to each other, and each of the bent portions is soldered on the same plane as the plane on which the first drive electrode 3 and the first detection electrode of the narrow portion 2B of the circuit board 2 are disposed. In this manner, as described above, the second drive electrode 5 and the second detection electrode 6 are vertically formed in a standing manner to face each other on the same plane on which the first drive electrode 3 and the first detection electrode of the narrow portion 2B of the circuit board 2 are disposed as described above. The first drive electrode 3 and the second drive electrode 5 are electrically connected to each other with a pattern connection.

The lock electrode (detection electrode), the drive electrode paring therewith, the unlock electrode (detection electrode), and the drive electrode pairing therewith need only be formed in a standing manner on the same plane of the circuit board to face each other. For example, facing electrodes may be formed without completely overlapping to secure a predetermined distance or more as a horizontal minimum distance between the facing electrodes. Furthermore, the electrodes may be bent according to conditions found by experiments such that projected areas of the facing portions are equal to or larger than a predetermined area.

In the first embodiment, with reference to FIG. 9 to FIG. 12, as described above, the electrode configuration described above is used in the second embodiment to make it possible to clearly discriminate the case in which one finger of a person contacts with the electrode from the case in which 100 ml of water contact with the electrode.

As described above, according to the embodiment, a voltage output when the dielectric substance is a hand of person is higher than a voltage output when the dielectric substance is water. For this reason, when the proximity sensor is built in a door handle, which dielectric substance which is brought close to or into contact with the door handle can be advantageously recognized. The antenna is disposed between the unlock electrode (detection electrode) and the drive electrode pairing therewith to make it possible to dispose the unlock electrode (detection electrode), the drive electrode pairing therewith, and the antenna on the same plane. For this reason, the thickness of the proximity sensor can be advantageously reduced. Furthermore, the antenna is disposed between the unlock electrode (detection electrode) and the drive electrode 5 pairing therewith to make the output voltage value of the proximity sensor in a stationary state high. For this reason, noise resistance is improved so as to advantageously improve the operational stability of the proximity sensor.

In the above description, the configuration in which the proximity sensor is applied to the keyless entry device has been described. The proximity sensor according to the present invention can also be applied to an arbitrary device except for the keyless entry device as a matter of course.

REFERENCE SIGNS LIST 1 proximity sensor
1A electrode portion of proximity sensor
2 circuit board
2A wide portion of circuit board
2B narrow portion of circuit board
3 first drive electrode
4 lock electrode (first detection electrode)
5 second drive electrode
6 unlock electrode (second detection electrode)
7 antenna
8 detection circuit
9 case
10 keyless entry device
11 electronic key (mobile transmitter)
12 actuator
13 first controller (keyless ECU)
14 operational amplifier
15 diode
16 operational amplifier
17 diode
18 second controller (microcomputer)
A threshold value of potential difference
C1, C2 capacitor
R1, R2 resistor
Vcc DC power supply
ΔV potential difference

What is claimed is:

1. A proximity sensor comprising:
a circuit board on which a detection circuit is printed; and
a planar first drive electrode and a planar first detection electrode which are mounted on one surface of the circuit board and electrically connected to the detection circuit,
wherein the first drive electrode and the first detection electrode are formed in a standing manner on one surface of the circuit board to face each other,
wherein the first drive electrode and the first detection electrode are formed such that both the longitudinal ends of a long and narrow rectangular conductive metal plate are bent at a right angle in directions opposite to each other and the first drive electrode and the first detection electrode are vertically formed in standing manner on the circuit board.

2. The proximity sensor according to claim 1, wherein a planar second drive electrode and a planar second detection electrode are formed in a standing manner on the other surface of the circuit board to face each other.

3. A proximity sensor comprising:
a circuit board on which a detection circuit is printed; and
a planar first drive electrode and a planar first detection electrode which are mounted on one surface of the circuit board and electrically connected to the detection circuit,
wherein the first drive electrode and the first detection electrode are formed in a standing manner on one surface of the circuit board to face each other, and an antenna is disposed between the first drive electrode and the first detection electrode, the antenna transmitting/receiving a signal to/from a mobile transmitter when proximity or contact to the first detection electrode is detected, between the first drive electrode and the first detection electrode,
wherein the first drive electrode and the first detection electrode are formed such that both the longitudinal ends of a long and narrow rectangular conductive metal plate are bent at a right angle in directions opposite to each other and the first drive electrode and the first detection electrode are vertically formed in standing manner on the circuit board.

4. The proximity sensor according to claim 3, wherein a planar second drive electrode and a planar second detection electrode are formed at a position spaced apart from the first drive electrode and the first detection electrode on the same plane as that on which the antenna of the circuit board is disposed to face each other.

5. A keyless entry device comprising:
a proximity sensor built in a door handle of a vehicle;
an antenna that transmits/receives a signal to/from a mobile transmitter when the proximity sensor detects proximity or contact of a person to the door handle;
an actuator that locks or unlocks a door of the vehicle; and
a controller that detects an ON/OFF state of the proximity sensor with an output from the proximity sensor and drives the actuator to lock or unlock the door when a code signal from the mobile transmitter received by the antenna when the proximity sensor is turned on is matched with a code signal inherent in the vehicle,
wherein the proximity sensor is configured such that, in the proximity sensor including a circuit board on which a detection circuit is printed and a planar first drive electrode and a planar first detection electrode which are mounted on one surface of the circuit board and electrically connected to the detection circuit, the first drive electrode and the first detection electrode are formed in a standing manner on one surface of the circuit board to face each other, and the controller determines that the proximity sensor is turned on when a decrease in output of the proximity sensor exceeds a predetermined threshold value,
wherein the controller supplies a drive voltage to the first drive electrode, repeatedly controls charging of a capacitor with a voltage output from the proximity sensor, measurement of a charging voltage value, and discharging of a charging voltage every predetermined period of time, compares a charging voltage value measured at this time with a charging voltage value measured previously, and determines that the proximity sensor is turned on when the difference between both the values exceeds a predetermined threshold value.

6. The keyless entry device according to claim 5, wherein one of the first detection electrode and a second detection electrode configures a lock electrode which detects an operation of a person in a door lock state, and the other configures an unlock electrode which detects an operation of the person in a door unlock state.

7. The keyless entry device according to claim 5, wherein the first drive electrode and the first detection electrode are formed such that both the longitudinal ends of a long and narrow rectangular conductive metal plate are bent at a right angle in directions opposite to each other and the first drive electrode and the first detection electrode are vertically formed in standing manner on the circuit board.

8. A keyless entry device comprising:
a proximity sensor built in a door handle of a vehicle;
an antenna that transmits/receives a signal to/from a mobile transmitter when the proximity sensor detects proximity or contact of a person to the door handle;
an actuator that locks or unlocks a door of the vehicle; and
a controller that detects an ON/OFF state of the proximity sensor with an output from the proximity sensor and drives the actuator to lock or unlock the door when a code signal from the mobile transmitter received by the antenna when the proximity sensor is turned on is matched with a code signal inherent in the vehicle,
wherein the proximity sensor is configured such that, in the proximity sensor including a circuit board on which a detection circuit is printed and a planar first drive electrode and a planar first detection electrode which are mounted on one surface of the circuit board and electrically connected to the detection circuit, the first drive electrode and the first detection electrode are formed in a standing manner on one surface of the circuit board to face each other, the antenna being disposed between the first drive electrode and the first detection electrode and transmitting/receiving a signal to/from the mobile transmitter when proximity or contact to the first detection electrode is detected, and the controller determines that the proximity sensor is turned on when a decrease in output of the proximity sensor exceeds a predetermined threshold value,
wherein the controller supplies a drive voltage to the first drive electrode, repeatedly controls charging of a capacitor with a voltage output from the proximity sensor, measurement of a charging voltage value, and discharging of a charging voltage every predetermined period of time, compares a charging voltage value measured at this time with a charging voltage value measured previously, and determines that the proximity sensor is turned on when the difference between both the values exceeds a predetermined threshold value.

9. The keyless entry device according to claim 8, wherein one of the first detection electrode and a second detection electrode configures a lock electrode which detects an operation of a person in a door lock state, and the other configures an unlock electrode which detects an operation of the person in a door unlock state.

10. The keyless entry device according to claim 8, wherein the first drive electrode and the first detection electrode are formed such that both the longitudinal ends of a long and narrow rectangular conductive metal plate are bent at a right angle in directions opposite to each other and the first drive electrode and the first detection electrode are vertically formed in standing manner on the circuit board.

\* \* \* \* \*

UNITED STATES PATENT AND TRADEMARK OFFICE
CERTIFICATE OF CORRECTION

PATENT NO.       : 9,835,751 B2
APPLICATION NO.  : 14/868733
DATED            : December 5, 2017
INVENTOR(S)      : Tetsuo Tokudome It is certified that error appears in the above-identified patent and that said Letters Patent is hereby corrected as shown below:

In the Claims

Column 14, Line 59, in Claim 3, Lines 14-15, the phrase ", between the first drive electrode and the first detection electrode" should be deleted.

Signed and Sealed this
Twelfth Day of June, 2018

Andrei Iancu
*Director of the United States Patent and Trademark Office*